United States Patent
Shih et al.

(10) Patent No.: US 10,992,101 B2
(45) Date of Patent: Apr. 27, 2021

(54) PACKAGE STRUCTURE FOR EDGE-EMITTING LASER

(71) Applicants: LITE-ON ELECTRONICS (GUANGZHOU) LIMITED, Guangzhou (CN); LITE-ON TECHNOLOGY CORPORATION, Taipei (TW)

(72) Inventors: Ming-Huang Shih, Taipei (TW); Wang-Jie Luo, Taipei (TW)

(73) Assignees: LITE-ON ELECTRONICS (GUANGZHOU) LIMITED; LITE-ON TECHNOLOGY CORPORATION

( * ) Notice: Subject to any disclaimer, the term of this patent is extended or adjusted under 35 U.S.C. 154(b) by 37 days.

(21) Appl. No.: 16/675,616

(22) Filed: Nov. 6, 2019

(65) Prior Publication Data
US 2020/0169060 A1    May 28, 2020

(30) Foreign Application Priority Data
Nov. 22, 2018  (CN) .......................... 201811396691.6

(51) Int. Cl.
| | | |
|---|---|---|
| *H01S 5/02255* | (2021.01) | |
| *H01S 5/02257* | (2021.01) | |
| *H01S 5/02253* | (2021.01) | |
| *H01S 5/02325* | (2021.01) | |
| *H01S 5/00* | (2006.01) | |
| *H01S 5/02208* | (2021.01) | |

(52) U.S. Cl.
CPC ...... *H01S 5/02257* (2021.01); *H01S 5/02253* (2021.01); *H01S 5/02255* (2021.01); *H01S 5/0071* (2013.01); *H01S 5/02208* (2013.01); *H01S 5/02325* (2021.01)

(58) Field of Classification Search
CPC .......................... H01S 5/02255; H01S 5/4075
See application file for complete search history.

(56) References Cited

U.S. PATENT DOCUMENTS

| | | | |
|---|---|---|---|
| 6,422,766 B1 * | 7/2002 | Althaus | G02B 6/4208 385/94 |
| 10,418,780 B1 * | 9/2019 | Hwang | H01S 5/02253 |
| 2018/0218574 A1 * | 8/2018 | Olmsted | G08B 5/36 |
| 2020/0132985 A1 * | 4/2020 | Enya | H01S 5/02446 |

FOREIGN PATENT DOCUMENTS

CN    105572812 A    5/2016

\* cited by examiner

*Primary Examiner* — Tod T Van Roy
(74) *Attorney, Agent, or Firm* — Innovation Counsel LLP

(57) ABSTRACT

A package structure includes a carrier, a housing, an edge-emitting laser, first and second reflective members and a diffractive optical element. The housing disposed on a mounting surface of the carrier has a receiving space and a top surface, which has an opening and a center line perpendicular to the top surface and the mounting surface. The edge-emitting laser disposed in the receiving space and on the mounting surface has a light-emitting surface emitting a laser beam. The first reflective member is disposed in the receiving space and spaced apart from the light-emitting surface. The second reflective member is disposed in the receiving space and located on the center line above the edge-emitting laser. The diffractive optical element is disposed on the top surface. The laser beam reflected by the first and second reflective members passes through the diffractive optical element to emit out of the housing.

10 Claims, 4 Drawing Sheets

PACKAGE STRUCTURE FOR EDGE-EMITTING LASER

This application claims the benefit of People's Republic of China application Serial No. 201811396691.6, filed Nov. 22, 2018, the subject matter of which is incorporated herein by reference.

BACKGROUND OF THE INVENTION

Field of the Invention

The invention relates to a package structure, and more particularly to a package structure for an edge-emitting laser.

Description of the Related Art

A conventional laser diode is mounted on a substrate in a form of a lead-type package structure, wherein a perpendicular distance (greater than 9 mm) is present between a mounting surface of the substrate and a collimating lens, so that the overall height of the package structure is increased, the volume of the package structure is also relatively increased, and the drawback of occupying too much space is present.

Thus, how to decrease the overall height of the package structure is a subject to be overcome in the industry.

SUMMARY OF THE INVENTION

The invention is directed to a package structure for an edge-emitting laser, wherein two reflective members are used to change a transmission path of the edge-emitting laser so that the overall height of the package structure is decreased, a light output axis can be held at a center of the package structure, and the package structure is more suitable for applications of portable electronic devices.

According to one aspect of the invention, a package structure is provided. The package structure includes a carrier, a housing, an edge-emitting laser, a first reflective member, a second reflective member and a diffractive optical element. The carrier has a mounting surface. The housing is disposed on the mounting surface and has a receiving space therein. A top surface of the housing has an opening and a center line perpendicular to the top surface and the mounting surface. The edge-emitting laser is received in the receiving space and located on the mounting surface. The edge-emitting laser has a light-emitting surface for emitting a laser beam. The first reflective member is received in the receiving space, and spaced apart from the light-emitting surface. The second reflective member is received in the receiving space, and located on a center line above the edge-emitting laser. The diffractive optical element is disposed on a top surface of the housing. The laser beam is reflected by the first reflective member and the second reflective member, and then passes through the diffractive optical element to emit out of the housing.

The above and other aspects of the invention will become better understood with regard to the following detailed description of the preferred but non-limiting embodiments. The following description is made with reference to the accompanying drawings.

DETAILED DESCRIPTION OF THE INVENTION

The embodiments will be described in detail herein below, and are only illustrative without limiting the scope of the invention. In the following illustration, the same/similar symbols represent the same/similar elements. Directional terms, such as above, under, left, right, front, back and the like mentioned in the following examples, only refer to the directions based on the drawings. Therefore, the directional terms are used to describe but not to limit the invention.

According to an embodiment of the invention, a package structure for an edge-emitting laser (EEL) is provided. The edge-emitting laser is a semiconductor component, such as a gallium arsenide chip, which generates resonance by photon reflection back and forth in a resonance cavity, and makes the high energy coherent light beam emit from the light-emitting surface on the lateral side of the chip, so that the laser beam is generated and is named as the "edge-emitting laser". This laser power is high, and the projected optical field can be elliptical. Compared with the surface emitting laser (SEL), which has the laser beam emitted from the surface of the chip and is named as the "surface emitting laser", the SEL has lower power and the projected optical field can be circular.

Upon application, the package structure for the edge-emitting laser or the surface emitting laser can be used as a dot projector for projecting structured light onto a target, so that an image sensor can perform depth recognition or face recognition of three-dimensional stereoscopic images of the target.

Figure 1:
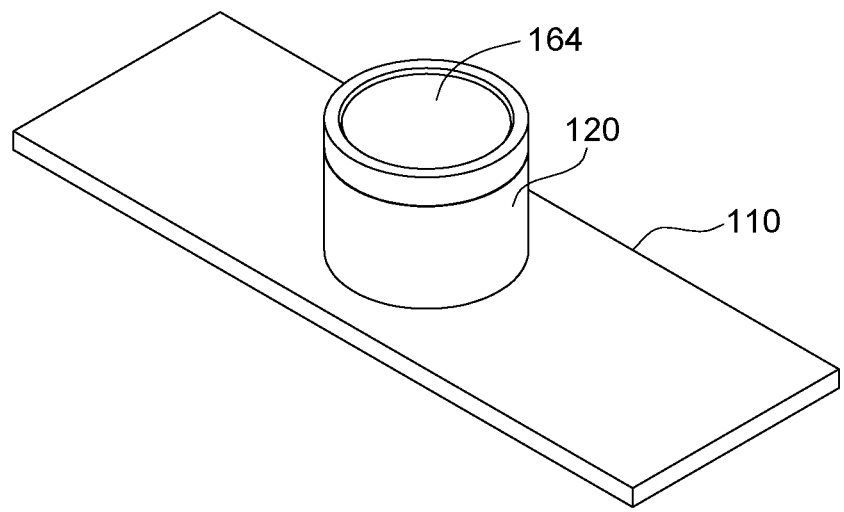
FIG. 1 is a schematic view showing a package structure for an edge-emitting laser according to an embodiment of the invention.
Figure 2:
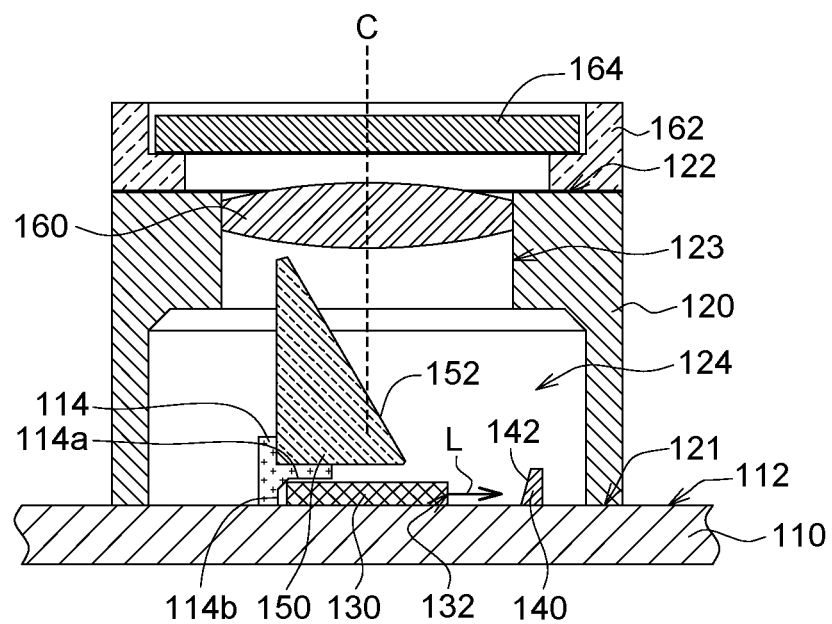
FIG. 2 is a schematic internal view showing the package structure having two reflective members.

Referring to FIGS. 1 and 2, a package structure 100 for an edge-emitting laser according to an embodiment of the invention includes a carrier 110, a housing 120, an edge-emitting laser 130, a first reflective member 140 and a second reflective member 150. The carrier 110 has a mounting surface 112. The housing 120 is disposed on the mounting surface 112, and a bottom surface 121 of the housing 120 can be fixed onto the mounting surface 112, for example, by an adhesive, so that a hermetic space is formed inside the housing 120.

In one embodiment, the cross section of the housing 120 is, for example, an inverse-U-shaped structure, and the housing 120 has a receiving space 124 therein. A top surface 122 of the housing 120 has an opening 123 communicating with the receiving space 124. The top surface 122 of the housing 120 and the mounting surface 112 are preferably parallel to each other, and are spaced apart by a predetermined distance. The opening 123 is located on one side of the housing 120 away from the carrier 110, and a center of the opening 123 is substantially located on a center line C. The center line C is substantially located at a middle of the housing 120, and is perpendicular to the top surface 122 of the housing 120 and the mounting surface 112.

Referring to FIG. 2, in one embodiment, a package structure 100 for an edge-emitting laser may further include a collimating lens 160, a fixing member 162 and a diffractive optical element 164. The collimating lens 160 is disposed in the opening 123, and a center of the collimating lens 160 is substantially located on the center line C. The collimating lens 160 allows the laser beam L to form a light beam parallel to the center line C. That is, the laser beam is parallel to an optical axis to reduce the energy loss of light propagation. The diffractive optical element 164 may be disposed inside the fixing member 162 and disposed on the top surface 122 of the housing 120 via the fixing member 162. However, the diffractive optical element 164 may be also disposed on the top surface 122 of the housing 120 by other means without being restricted to the implementation shown in the figures. The diffractive optical element 164 is used to shape and output the light beam passing through the collimating lens 160, so that the package structure generates the specific structured light through the texture design of the diffractive optical element 164.

The edge-emitting laser 130 is received in the receiving space 124, and located on the mounting surface 112 of the carrier 110. The edge-emitting laser 130 has a light-emitting surface 132 for emitting a laser beam L. The edge-emitting laser 130 is fixed onto the mounting surface 112 by a die bonding paste. The carrier 110 is a circuit board, for example, and is electrically connected to the edge-emitting laser 130 through wires. However, the edge-emitting laser 130 may be also disposed on the mounting surface 112 by other means without being restricted to the implementation shown in the figures.

The first reflective member 140 is received in the receiving space 124, and located on the mounting surface 112 of the carrier 110. That is, the first reflective member 140 and the edge-emitting laser 130 are disposed in a co-planar manner, and spaced apart by a predetermined distance. In one embodiment, the first reflective member 140 can be fixed onto the mounting surface 112 by an adhesive or by way of plugging, and the first reflective member 140 has a first reflective surface 142, which is a reflecting mirror surface or with a reflective coating, for example. The first reflective member 140 is preferably a reflecting mirror or a prism with a reflectance greater than 80% to reduce the optical loss.

The second reflective member 150 is received in the receiving space 124, and located on the center line C above the edge-emitting laser 130. That is, the second reflective member 150 and the edge-emitting laser 130 are not disposed in a co-planar manner, the first reflective member 140 is spaced apart from the second reflective member 150 by a predetermined distance, and a height difference (or step) is formed between the first reflective member 140 and the second reflective member 150.

The first reflective member 140 and the second reflective member 150 are cones or right triangles, for example, and have the sizes that can be adjusted according to actual requirements. In one embodiment, a height and a bevel length of the second reflective member 150 are, for example, at least 3 times of a height and a bevel length of the first reflective member 140, so that the second reflective member 150 has a sufficient large reflective area to direct the laser beam L to the center of the housing 120.

Referring to FIG. 2, in one embodiment, a holder 114 is disposed in the receiving space 124, and the second reflective member 150 may be disposed on the holder 114, so that the second reflective member 150 is located above the edge-emitting laser 130. The holder 114 can be fixed onto the mounting surface 112, for example, by an adhesive or by way of plugging. The second reflective member 150 can be fixed onto the holder 114 by an adhesive or by way of plugging, so that a height difference is formed between the bottom surface of the second reflective member 150 and the mounting surface 112. In one embodiment, the holder 114 is, for example, T-shaped, the holder 114 includes a horizontal surface 114a and a vertical surface 114b, the second reflective member 150 is disposed above the horizontal surface 114a, the horizontal surface 114a and the mounting surface 112 are parallel to each other with a height difference formed therebetween, the vertical surface 114b is connected between the horizontal surface 114a and the mounting surface 112, and the above-mentioned height difference is substantially equal to the height of the edge-emitting laser 130 to reduce the overall height of the package structure 100. In addition, the second reflective member 150 has a second reflective surface 152, which is a reflecting mirror surface or with a reflective coating, for example. The second reflective member 150 is preferably a reflecting mirror or a prism with a reflectance greater than 80% to reduce the optical loss.

Figure 3:
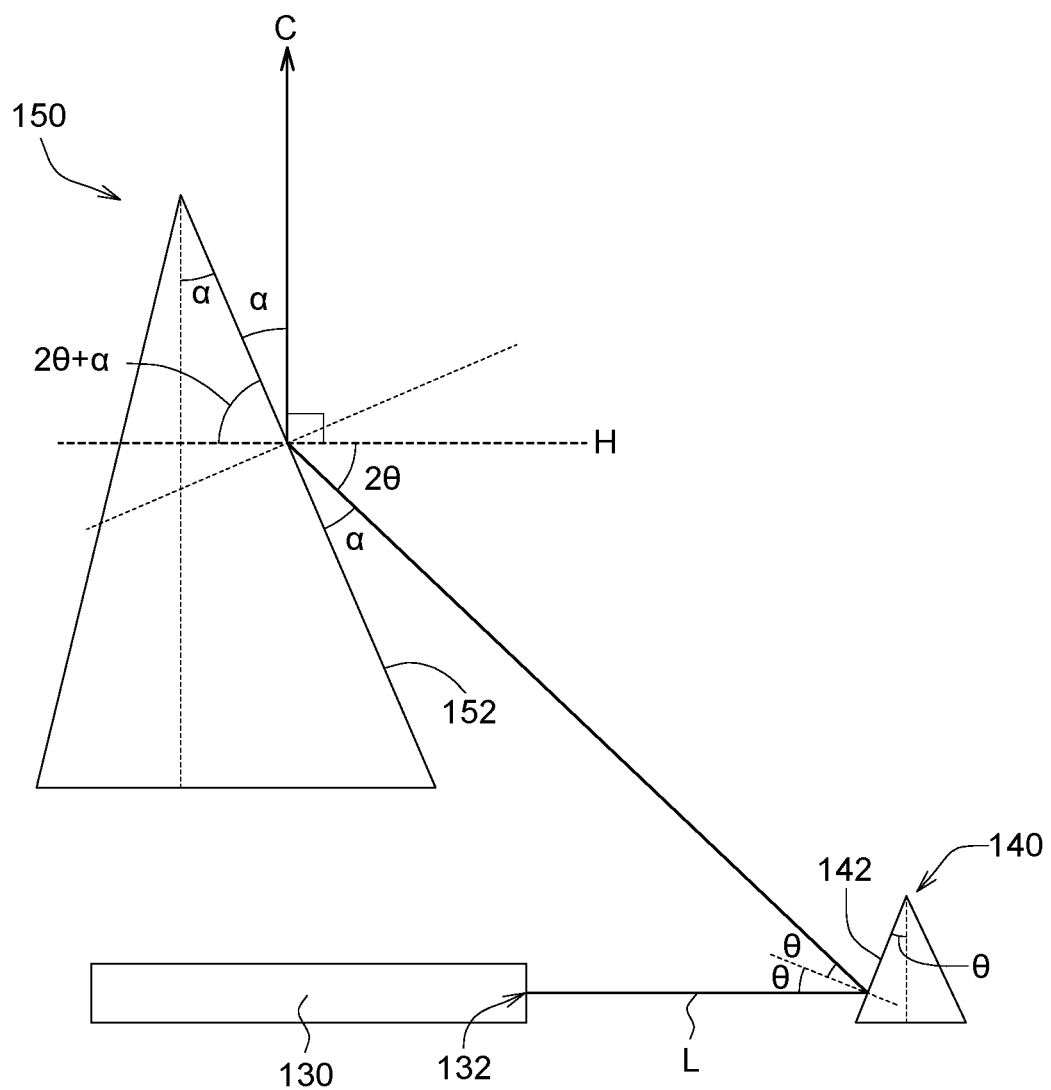
FIG. 3 is an optical path diagram of a laser beam.

FIG. 3 is an optical path diagram of the laser beam L. Referring to FIG. 3, the edge-emitting laser 130 has a light-emitting surface 132 facing the first reflective member 140. After the laser beam L is emitted from the light-emitting surface 132, the laser beam L is reflected by the first reflective surface 142 to reach the second reflective surface 152. The first reflective surface 142 has a first included angle $\theta$ relative to a light output axis C, the second reflective surface 152 has a second included angle $\alpha$ relative to the light output axis C, and the sum of the first included angle $\theta$ and the second included angle $\alpha$ is equal to 45 degrees.

Referring to FIG. 3, the laser beam L reaches the first reflective surface 142 at a first incident angle $\theta$, and is further reflected at a first reflection angle $\theta$. Next, when the laser beam L reaches the second reflective surface 152 at a second incident angle, an included angle of the laser beam L relative to the horizontal line H and the sum of the first incident angle and the first reflection angle are alternate interior angles. Therefore, it is obtained that the included angle of the laser beam L relative to the horizontal line H may be a double of the first included angle $\theta$ (i.e., equal to $2\theta$). The included angle between the laser beam L and the second reflective surface 152 is defined as the second included angle $\alpha$, wherein the second incident angle can be defined as a complementary angle of the second included angle $\alpha$.

Next, after the laser beam L is reflected again at a second reflection angle, the laser beam L is substantially emitted upward along the center line C on the vertical axis. As shown in the drawing, the included angle between the second reflective surface 152 and the horizontal line H is the sum of a double of the first reflection angle and the second included angle $\alpha$ (i.e., $2\theta+\alpha$), and the opposite angle thereof is also equal to $(2\theta+\alpha)$. In addition, because the sum of the included angle $(2\theta+\alpha)$ and the second included angle $\alpha$ is equal to 90 degrees ($2*(\theta+\alpha)=90$ degrees), it is obtained that the sum of the first included angle $\theta$ and the second included angle $\alpha$ is equal to 45 degrees.

According to the derivation of the above-mentioned formula, when the sum of the first included angle $\theta$ and the second included angle $\alpha$ is equal to 45 degrees, that is, when the sum of the included angle between the first reflective surface 142 and the light output axis C and the included angle between the second reflective surface 152 and the light output axis C is equal to 45 degrees, an optical path of the laser beam L may be emitted along the light output axis C, and the optical path of the laser beam L is maintained substantially at the center of the package structure 100, and is not offset to the top of the first reflective member 140. Therefore, it is possible to prevent the optical path of the laser beam L from bias-shift, and then shorten the adjustment time.

In addition, after the laser beam L of the edge-emitting laser 130 is reflected twice, the distance of the optical path is increased. Therefore, the perpendicular distance from the top surface 122 of the housing 120 to the mounting surface 112 of the carrier 110 can be significantly decreased to be smaller than 5 mm, for example, to decrease the overall height of the package structure 100, and the volume of the package structure 100 is also relatively reduced to meet the requirements of the market.

Figure 4:
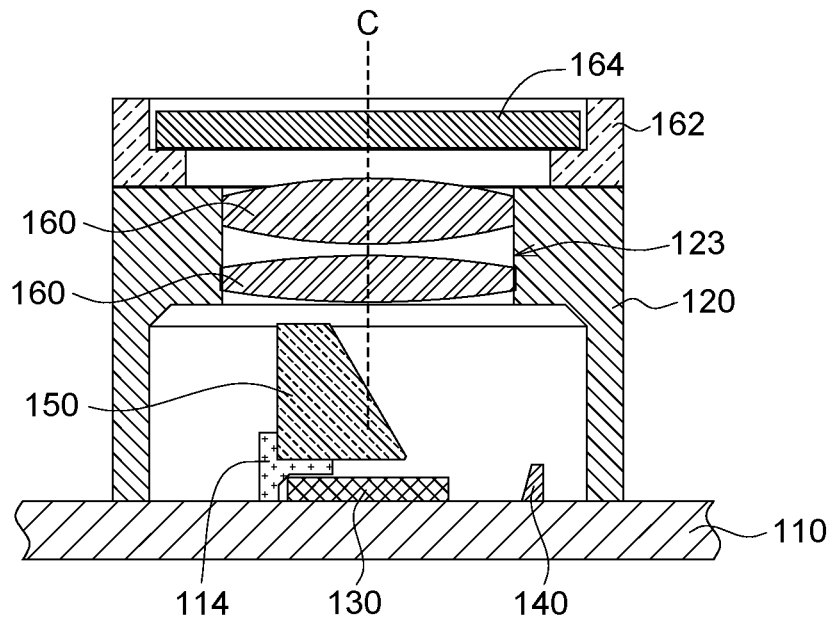
FIG. 4 is a schematic internal view showing the package structure having multiple collimating lenses.

FIG. 4 is a schematic view showing a package structure 100 having multiple collimating lenses 160. Referring to FIG. 4, the configuration is substantially the same as the above-mentioned embodiment except for the differences that the multiple collimating lenses 160 are disposed in the opening 123, and that the appearance and the height of the second reflective member 150 can be changed and meet the overall height of the package structure 100. In this embodiment, although the height of the second reflective member 150 is reduced, the laser beam L still can be reflected by the first reflective member 140 and the second reflective member 150 and then passes through the collimating lenses 160 and the diffractive optical element 164 to emit out of the housing 120 along the light output axis C. The use of the multiple collimating lenses 160 in this embodiment can obtain a better optical pattern than that obtained with the use of one collimating lens 160.

Figure 5:
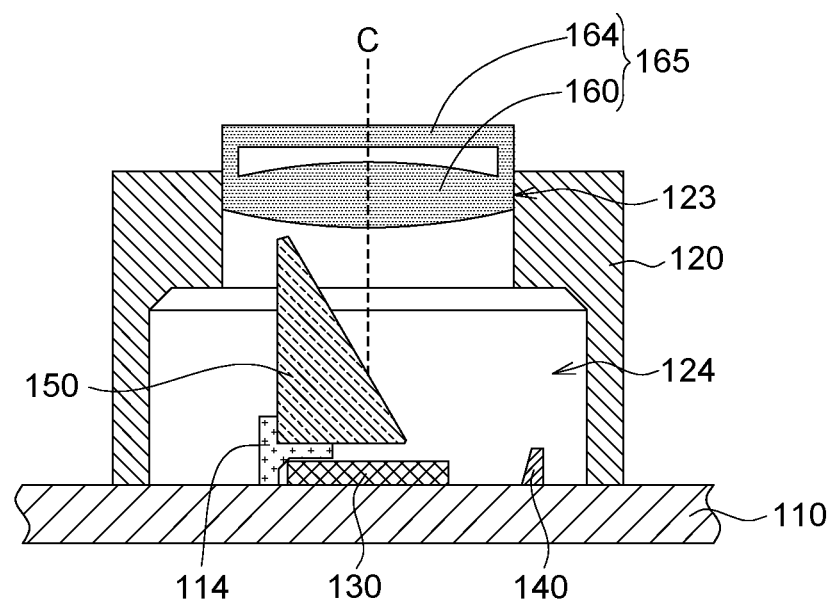
FIG. 5 is a schematic internal view showing the package structure having a diffractive optical element and a collimating lens which are integrally formed.

FIG. 5 is a schematic view showing a package structure 100 having the diffractive optical element 164 and the collimating lens 160 which are integrally formed. Referring to FIG. 5, its configuration is substantially the same as the above-mentioned embodiment except for the difference that the diffractive optical element 164 and the collimating lens 160 are combined into one single element 165. Thus, the diffractive optical element 164 and the collimating lens 160 may be directly disposed in the opening 123 of the housing 120 without re-mounting the fixing member 162 for fixing the diffractive optical element 164, so that the number of components is reduced, and the overall height of the package structure 100 is further reduced.

Figure 6:
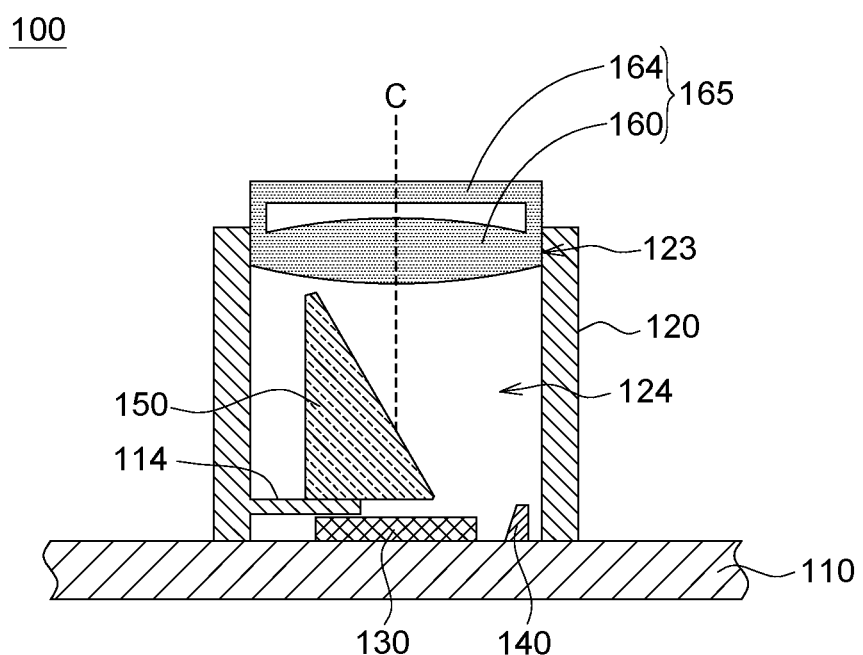
FIG. 6 is a schematic internal view showing the package structure having a holder integrally formed with a housing.

FIG. 6 is a schematic view showing a package structure 100 having the holder 114 integrally formed with the housing 120. Referring to FIG. 6, its configuration is substantially the same as the above-mentioned embodiment except for the difference that the holder 114 and the housing 120 are combined into one member (e.g., integrally formed by injection molding). Thus, the number of components can be reduced and the time of mounting the components can be shortened. In addition, in the above-mentioned embodiment, an aperture of the opening 123 is smaller than a width of the receiving space 124; while in this embodiment, the housing 120 is a hollow cylinder, and the aperture of the opening 123 is equal to the width (i.e., diameter) of the receiving space 124 to further reduce the volume of the package structure 100.

The package structure for the edge-emitting laser according to the above-mentioned embodiments of the invention can overcome the problem that the perpendicular distance between the mounting surface of the conventional edge-emitting laser and the collimating lens is too long, and can reduce the overall height of the package structure. In addition, after the laser beam of the edge-emitting laser is reflected twice, the optical path of the laser beam may be maintained substantially at the center of the package structure, the condition that the optical path of the conventional laser beam needs to be adjusted according to the offset error of the optical path can be thus avoided, and the adjustment time can be further shortened.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure for an edge-emitting laser, comprising:
    a carrier having a mounting surface;
    a housing disposed on the mounting surface, wherein the housing has a receiving space, and a top surface of the housing has an opening and a center line perpendicular to the top surface and the mounting surface;
    an edge-emitting laser received in the receiving space and located on the mounting surface, wherein the edge-emitting laser has a light-emitting surface for emitting a laser beam;
    a first reflective member received in the receiving space and spaced apart from the light-emitting surface;
    a second reflective member received in the receiving space and located on the center line directly above the edge-emitting laser; and
    a diffractive optical element disposed on the top surface of the housing, wherein the laser beam is reflected by the first reflective member followed by the second reflective member, and then passes through the diffractive optical element to emit out of the housing.

2. The package structure according to claim 1, further comprising a collimating lens disposed in the opening, wherein the laser beam is reflected by the first reflective member and the second reflective member, and sequentially passes through the collimating lens and the diffractive optical element to emit out of the housing.

3. The package structure according to claim 2, wherein the collimating lens and the diffractive optical element are integrally formed.

4. The package structure according to claim 1, further comprising a fixing member, wherein the diffractive optical element is disposed on the fixing member, and the fixing member is disposed on the top surface of the housing.

5. The package structure according to claim 1, further comprising a holder, the holder being disposed on the mounting surface and being accommodated within the receiving space, wherein the second reflective member is disposed on the holder.

6. The package structure according to claim 5, wherein the holder is T-shaped, and comprises a horizontal surface and a vertical surface, the second reflective member is disposed above the horizontal surface, the horizontal surface and the mounting surface are parallel to each other with a height difference formed between the horizontal surface and the mounting surface, the vertical surface is connected between the horizontal surface and the mounting surface, and the height difference is substantially equal to a height of the edge-emitting laser.

7. The package structure according to claim 1, further comprising a holder, the holder being integrally formed with the housing and accommodated within the receiving space, wherein the second reflective member is disposed on the holder.

8. The package structure according to claim 1, wherein the first reflective member has a first reflective surface, the second reflective member has a second reflective surface, and a sum of an included angle between the first reflective surface and the center line and an included angle between the second reflective surface and the center line is equal to 45 degrees.

9. The package structure according to claim 8, wherein the first reflective surface or the second reflective surface is a reflecting mirror surface or with a reflective coating.

10. The package structure according to claim 1, wherein the first reflective member and the edge-emitting laser are disposed in a co-planar manner, and a height difference is formed between the first reflective member and the second reflective member.

\* \* \* \* \*